United States Patent [19]
Yang

[11] Patent Number: 5,773,980
[45] Date of Patent: Jun. 30, 1998

[54] ONE-TERMINAL FAULT LOCATION SYSTEM THAT CORRECTS FOR FAULT RESISTANCE EFFECTS

[75] Inventor: Lifeng Yang, Coral Springs, Fla.

[73] Assignee: ABB Power T&D Company, Inc., Raleigh, N.C.

[21] Appl. No.: 791,816

[22] Filed: Jan. 30, 1997

[51] Int. Cl.⁶ .................................................. G01R 31/08
[52] U.S. Cl. ........................... 324/525; 324/522; 361/62; 364/483; 364/482
[58] Field of Search .................................... 324/509, 512, 324/521, 522, 525; 361/42, 47, 62, 65; 364/482, 483, 492

[56] References Cited

U.S. PATENT DOCUMENTS

| 4,559,491 | 12/1985 | Saha | 324/522 |
| 4,719,580 | 1/1988 | Nimmersjo | 364/483 |
| 4,812,995 | 3/1989 | Girgis et al. | 324/512 X |
| 4,906,937 | 3/1990 | Wikstrom et al. | 324/522 |
| 5,428,549 | 6/1995 | Chen | 364/483 |
| 5,455,776 | 10/1995 | Novosel | 364/492 |
| 5,661,664 | 8/1997 | Novoel et al. | 364/492 |

OTHER PUBLICATIONS

Elmore, Walter, "Evolution of Distance Relaying Principles," 48th Annual Conference for Protective Relay Engineers, Texas A&M University, College Station, Texas, Apr. 3–5, 1995.

Primary Examiner—Glenn W. Brown
Attorney, Agent, or Firm—Woodcock Washburn Kurtz Mackiewicz & Norris LLP

[57] ABSTRACT

A one-terminal process for locating a fault associated with a multi-phase electric power transmission system is disclosed. The process is based on the principle that the impedance in a fault can be determined by correcting errors due to the interaction of fault resistance and load current. The fault may be a phase-to-ground fault or a multiple-phase fault.

12 Claims, 4 Drawing Sheets

NORMAL BALANCED
CONDITIONS

NOTE:
AT THE FAULT
$V_{ab} = V_{bc} = V_{ca} = 0$

THREE PHASE FAULT

NOTE:
AT THE FAULT $V_{bc} = 0$

PHASE "b"-TO-PHASE "c"
FAULT

NOTE:
AT THE FAULT
$V_{bc} = V_{bg} = V_{cg} = 0$

PHASE "b" TO-PHASE-
"c"-TO-GROUND FAULT

NOTE:
AT THE FAULT $V_{ag} = 0$

PHASE "a" TO-GROUND FAULT 5,773,980

ONE-TERMINAL FAULT LOCATION SYSTEM THAT CORRECTS FOR FAULT RESISTANCE EFFECTS

FIELD OF THE INVENTION

The present invention relates generally to the field of protective relaying. More particularly, the invention relates to a system for automatically locating faults on an electrical transmission line by processing voltage and current phasors measured at a single end of the line.

BACKGROUND OF THE INVENTION

Protective relaying generally involves the performance of one or more of the following functions in connection with a protected power or energy system: (a) monitoring, which involves determining whether the system is in a normal or abnormal state; (b) metering, which involves measuring certain electrical quantities; (c) protection, which typically involves tripping a circuit breaker in response to the detection of a short-circuit condition; and (d) alarming, which provides a warning of some impending problem. Fault location is associated with the protection function. It involves measuring critical system parameters and, when a fault occurs, making an estimate of the fault location so that the faulted line can be returned to service as quickly as possible.

The phasor diagrams in FIGS. 1A–1E illustrate the effect of faults on the system voltages and currents. The diagrams are for effectively grounded systems, wherein the neutral is solidly grounded, and for the ideal case of a zero fault resistance ($R_F=0$). However, they are illustrative of the effects of faults on other types of systems, e.g., ungrounded and impedance grounded systems. In the diagrams, the dotted, uncollapsed voltage triangle exists in the source (the generator) and the maximum collapse is at the fault location. The voltages between the source and fault will vary between these extremes. The diagrams depict the effects of various types of faults on the currents and voltages (represented by phasors) in the system. FIG. 1A depicts the phasors for normal, balanced conditions; FIG. 1B depicts the phasors for a three-phase fault ($V_{ab}=V_{bc}=V_{ca}=0$ at the fault); FIG. 1C depicts the phasors for a phase b-to-phase c fault ($V_{bc}=0$ at the fault); FIG. 1D depicts the phasors for a phase b-to-phase c-to-ground fault ($V_{bc}=V_{bg}=V_{cg}=0$ at the fault); and FIG. 1E depicts the phasors for a phase a-to-ground fault ($V_{ag}=0$ at the fault).

An accurate estimate of the fault location is important to the utilities, particularly in bad weather and/or rough terrain, to avoid cumbersome searches and delays in line restoration. Accuracy is particularly important for long lines because with long lines a large percentage error in the fault location estimate represents a considerable distance. Furthermore, the fault condition may be temporary, due to fault clearing and/or a change in weather conditions, and not readily visible. In successful reclosing, accurate fault location information may be necessary to locate weak spots on the line and to speed the analysis of the disturbance.

Fault location systems may be classified as two-terminal data systems or one-terminal data systems. With two-terminal data systems, voltages and currents are measured at opposite ends of the protected line(s). These systems typically are more accurate than one-terminal data systems. However, two-terminal systems have a disadvantage in that communication between the respective terminals is required. Since end-to-end communication is not always available and can be interrupted, the requirement for data from two ends of the protected line represents a disadvantage of two-terminal data systems. With one-terminal data systems, only local voltages and currents are required. End-to-end communication is not required.

In one known one-terminal data system, certain initial values, both for the argument difference and the fault distance, are assumed, and the current and voltage at the fault point are determined. If these two quantities are not in phase, new values of the argument difference and the fault distance are assumed. This procedure is repeated until the calculated fault current and the fault voltage are in phase. The last calculated value of the fault distance is assumed to be the correct value. However, small changes in the assumed value of the argument difference result in great changes of the calculated fault distance. Therefore, this system in many cases provides completely incorrect values or fails to converge toward a definite fault distance.

Another known system for locating faults with respect to a single monitoring point examines the time taken for a disturbance to travel from the monitoring point to the fault and back to the monitoring point after reflection at the fault point. A problem which could arise with this system is that the reflected disturbance could be confused with other disturbances arriving at the monitoring point as a result of reflections from other points in the transmission system. This could result in the protected section of the system being unnecessarily removed from service, when the fault is outside the protected section.

U.S. Pat. No. 4,559,491, Dec. 17, 1985, "Method and Device for Locating a Fault Point On a Three-Phase Power Transmission Line," discloses a method whereby currents and voltages are measured at a measuring point arranged at one end of a section of a three-phase transmission line. FIG. 2 is a one-line schematic diagram of the disclosed system. The transmission line section under consideration has a length DL between its end points A and B. A fault locator FL is arranged adjacent to the end point A and is connected to the line via voltage and current transformers 1, 2 that feed measuring signals u and i to the fault locator. The signals u and i are proportional to the voltages and currents at the point A. The line section has an impedance $Z_L$. A fault of arbitrary type is assumed to have occurred at a point F at the distance DF from the end point A. If n=DF/DL, the line impedance between the points A and F is n×$Z_L$ and between the points F and B the line impedance is (1−n)×$Z_L$. The network located "behind" end point A has a source voltage $E_A$ and an impedance $Z_A$. The network located "ahead of" the end point B has a source voltage $E_B$ and an impedance $Z_B$. It is assumed that $Z_L$ is a known parameter. The patent discloses that $Z_A$ may be known or may be calculated from measured values of currents and voltages taken at the end point A before and after a fault, and that $Z_B$ may be known but, if not, should be determinable with an acceptable degree of accuracy so that its value can be set in the fault locator FL.

When a fault occurs, the fault locator estimates the unknown distance DF (or the ratio n which gives the relative distance) from measured values of currents and voltages at the end point A before and after the fault and from pre-set or calculated values of the parameters $Z_A$, $Z_B$, $Z_L$. To estimate the fault location, the system determines the fault type and the measured currents and voltages are filtered for formation of their fundamental frequency components. Guided by the fault type and the complex values of the fundamental frequency components of the measured values, the impedance of the line section and the pre-set or calculated values of the impedances of the networks lying ahead of and behind the fault distance (n) are determined as the solution of the quadratic equation $$n^2 + B \times n + C = 0,$$

where n is the fault distance and B and C are dependent on the impedances and the fundamental frequency components of the measured values. (In the below description of the present invention, the fault location parameter is referred to as "m"). A shortcoming of this technique is that values of source impedance $Z_A$ and $Z_B$ are needed if the error introduced by fault resistance is to be fully compensated. (In the description of the present invention, the source impedances $Z_A$, $Z_B$ are referred to as $Z_s$ and $Z_R$). Source impedances change due to the changes in network configuration and information about their values is not readily available. A change in network configuration will degrade the accuracy of this technique.

In application Ser. No. 08/515,274 filed by Novasel ("Novasel") entitled "One-Terminal Data Fault Location System," which is assigned to the assignee of the present invention, a system for locating faults from one-terminal data is disclosed. Using a phase "a" fault as an example, Novasel determines the fault location based on the following equation:

$$VR_a = IR_a m Z_{11} + I_{a2} D$$

where: $VR_a$ is the voltage as measured from the relay;
$IR_a$ is the compensated relay current;
$Z_{11}$ is the line positive sequence impedance;
$I_{a2}$ is the negative sequence current;
$R_f$ is equal to the fault resistance;
D is the fault resistance divided by the positive sequence distribution factor; and
m is indicative of the fault location.
$IR_a$ is further defined as $I_a + 3KI_0$, and D is further defined as:

$$\frac{3R}{K_1}$$

where $R_f$ is the fault resistance and $K_1$ is the positive sequence distribution factor.

The equation has two unknowns m and D. To solve for m and find the fault location, the voltage equation is split into real and imaginary equations as follows:

$$Re\{VRx\} = mRe\{IR_x Z_{11}\} + DRe\{I_{x2}\}$$

and $$Im\{VRx\} = mIm\{IR_x Z_{11}\} + DIm\{I_{x2}\}$$

With two equations and two unknowns, the equation can then be solved for m. The equation accurately determines m for most fault conditions. However, under certain unique fault conditions, the equations could become ill-conditioned. That is, the two equations become equivalent or contradictory. Under such conditions, the resulting value for m will be invalid.

Accordingly, there is a need for an improved one-terminal data fault location system that offers advantages over the prior art. The present invention provides such a system.

SUMMARY OF THE INVENTION

The present invention provides a fault location system for accurately locating a phase-to-ground fault or phase-to-phase fault associated with one or more conductors of an electric power transmission or distribution system. The system disclosed herein is useful in automatically estimating the location of faults in transmission lines.

The inventive process comprises measuring at least one voltage phasor and at least one current phasor. Each voltage phasor is indicative of an amplitude and phase associated with a voltage waveform at a first prescribed location and each current phasor is indicative of an amplitude and phase associated with a current waveform at the first prescribed location. A fault location parameter m indicative of the location of the fault is computed as:

$$m = \frac{X_x + R_x \tan(\arg(I_x') - \arg(I_m))}{X_{11} + R_{11} \tan(\arg(I_x') - \arg(I_m))}$$

where:
$X_x$ = an imaginary portion of a faulted circuit impedance;
$R_x$ = a real portion of a faulted circuit impedance;
$X_{11}$ = a positive sequence line reactance;
$R_{11}$ = a positive sequence line resistance;
$I_x'$ varies depending upon the fault type. In a single-phase-to-ground fault, $I_x'$ is the current phasor plus compensation for cross coupling effects; whereas it is a difference between current phasors in a multiple-phase fault; and
$I_m$ also varies depending upon the fault type. In a single-phase-to-ground fault, $I_m$ is equal to a negative sequence current of the current phasor;
whereas in a multiple-phase fault, $I_m$ is a difference between pre-fault load currents and the current phasors.

DETAILED DESCRIPTION OF PREFERRED EMBODIMENTS

The present invention provides a system (methods and apparatus) for estimating a fault location parameter that is indicative of the location of the fault. In preferred embodiments of the invention, voltage and current phasors from one terminal of a protected line are required. Although the invention is described throughout the description in reference to a protective relay, it is not necessary that these phasors be provided by a protective relay per se, as they could be computed in a separate processor. For example, the invention may be incorporated into a separate fault location device. The invention may be implemented as part of a fault-location software package for use with a protective relaying system.

I. System Description

Figure 1A:
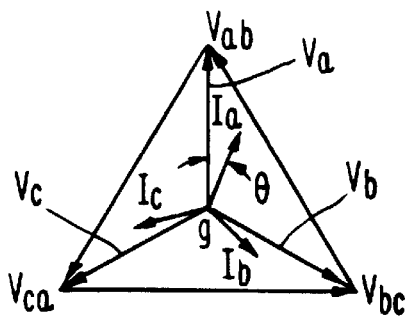
FIGS. 1A–1E are phasor diagrams depicting the effects of various types of faults on the currents and voltages of a typical power system.
Figure 1B:
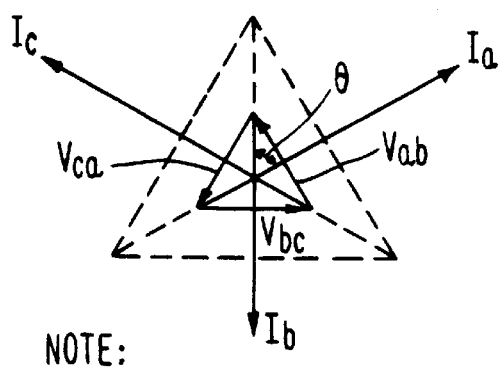
Figure 1C:
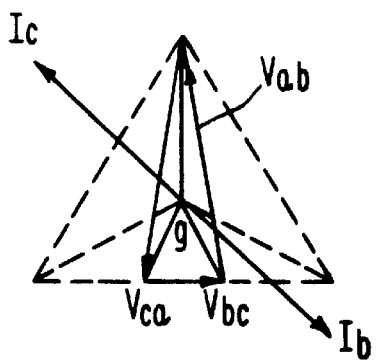
Figure 1D:
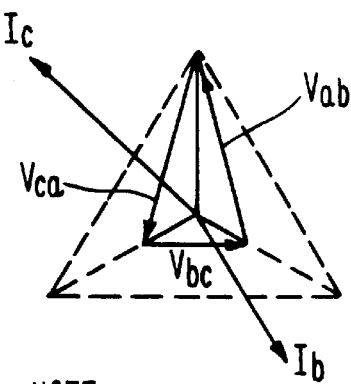
Figure 1E:
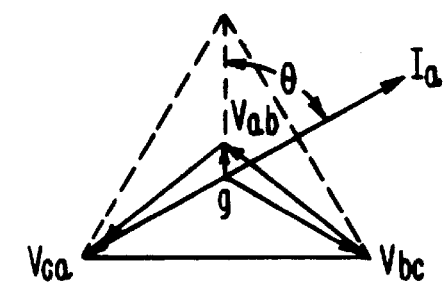
Figure 3A:
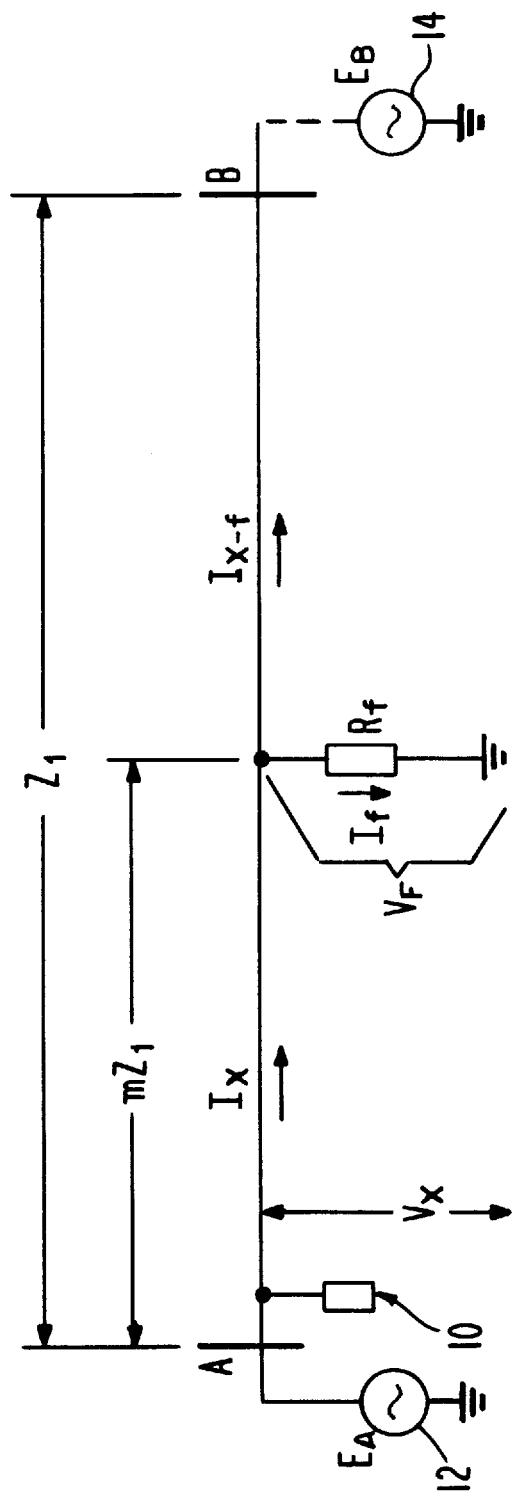
FIG. 3A is a single-line diagram of a transmission line system with a fault through an impedance $R_f$ on a homogeneous line of impedance $Z_1$ between buses A and B.
Figure 2:
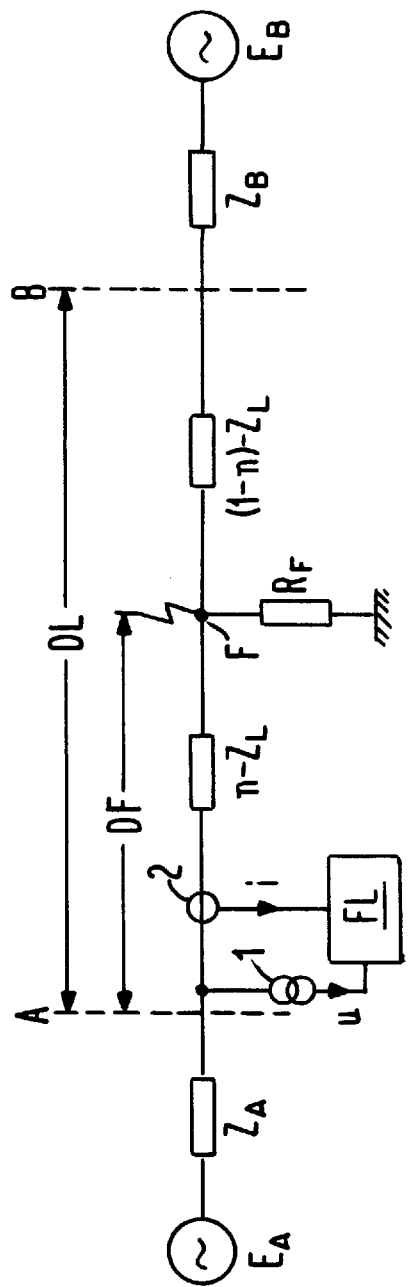
FIG. 2 is a schematic diagram referred to above in explaining one prior art fault location system.
Figure 3:
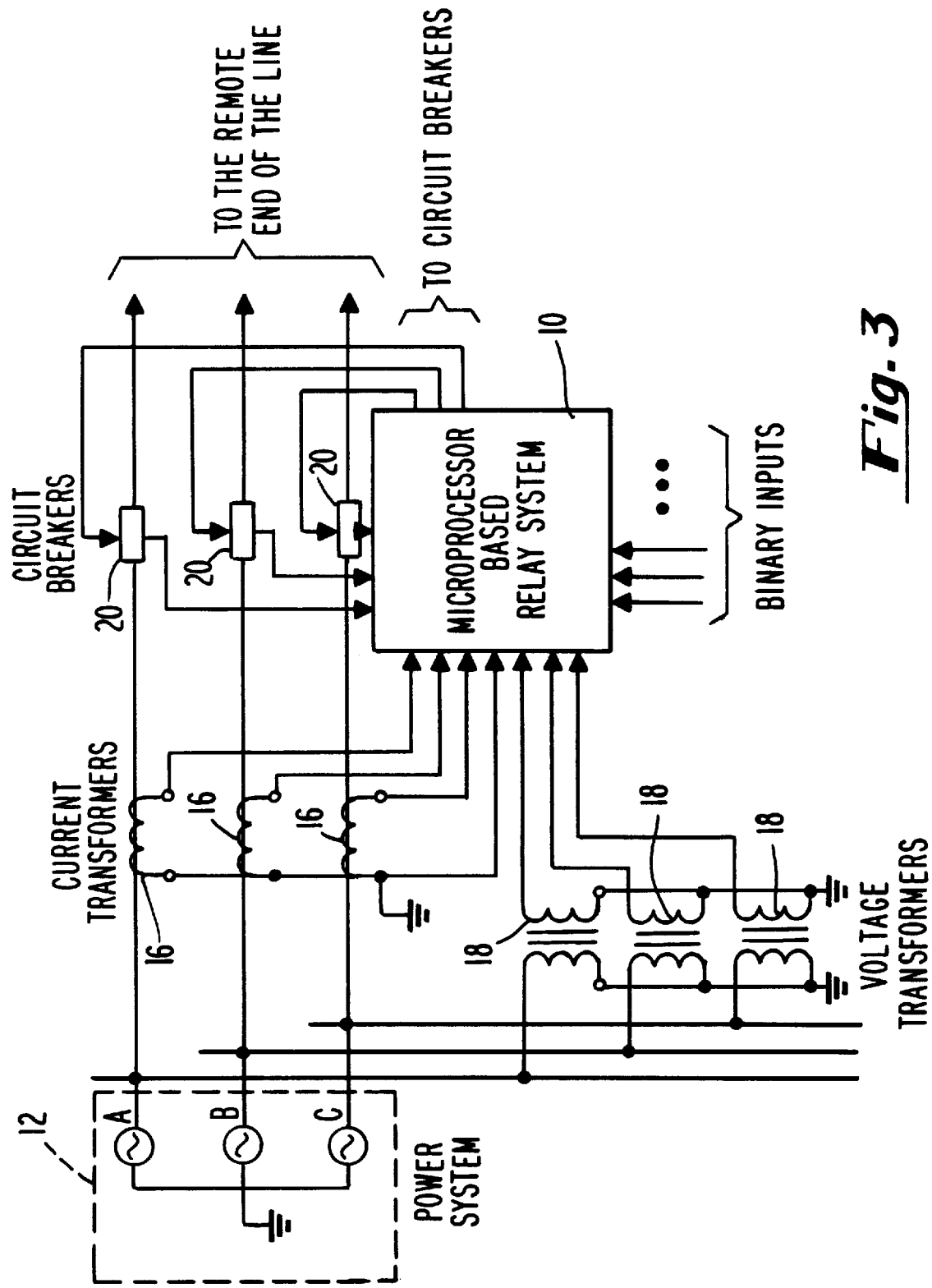
FIG. 3 is a schematic diagram of a fault location system in accordance with the present invention.

FIG. 3 schematically depicts an exemplary microprocessor based protective relay in a three-phase power system wherein the present invention may be employed. Power source 12 provides voltage and current to the three-phases a, b and c of the system. Current transformers 16 provide a mechanism to supply a measure of the current flowing through each respective phase of the power system to microprocessor based relay 10. Similarly, voltage transformers 18 provide a mechanism to supply a measure of the voltage on each respective phase of the power system to microprocessor based relay 10. Additionally, binary inputs may be supplied to the microprocessor based relay. Inside the relay, a trip decision is made based on information obtained from the inputs. If a decision is made to trip, sufficient data is gathered from the lines to determine the fault location. Thereafter, a signal is provided from relay 10 to the appropriate circuit breaker or circuit breakers 20, causing the circuit to open.

Phase currents and voltages are continuously monitored for fault conditions. The processes for determining when a fault has occurred are numerous and complex, and are known to those skilled in the art. Accordingly, the description of such processes are left out of the present discussion for clarity and brevity. However, after a fault has been detected, the fault location process executes according to the details set forth below.

FIG. 3A is a single-line diagram of the system, with a fault through an impedance $R_f$ on a homogeneous line (impedance $Z_1$) between buses A and B. A single-phase representation is initially used as a preliminary step in deriving the fault location process for a multi-phase transmission system. The elements of the model represent physical quantities for the phase "x", where x is one of a, b or c. The elements of the model are defined as follows:

$V_x$: Local bus voltage;

$I_x$: Current through the transmission line before the fault point from the source $E_A$;

$R_f$: Fault resistance (assumed to be real);

$I_f$: Current through the fault resistance;

$V_F$: Voltage across the fault resistance;

$Z_1$: Impedance of the total transmission line;

$I_{x-f}$: Current flowing to the load after the fault point or the contribution of current from the source $E_B$;

m: Relay to fault distance as a ratio of the total line length.

The value m is representative of the fault location. A further step is required to translate m into a location distance in miles or kilometers. For example, if the length of the line between the buses A and B is known, the distance to the fault can be found by multiplying the length of the line by the value m. Additional examples of converting m into miles or kilometers are provided below.

For a single phase to ground fault (e.g., phase "a" to ground), a first variation of the process of the invention is employed. For multiple phase faults (e.g., phase "a" to phase "b" to ground), then a second variation of the process is employed to solve for m. The two process variations are described below in reference to the flow chart of FIG. 4.

Figure 4:
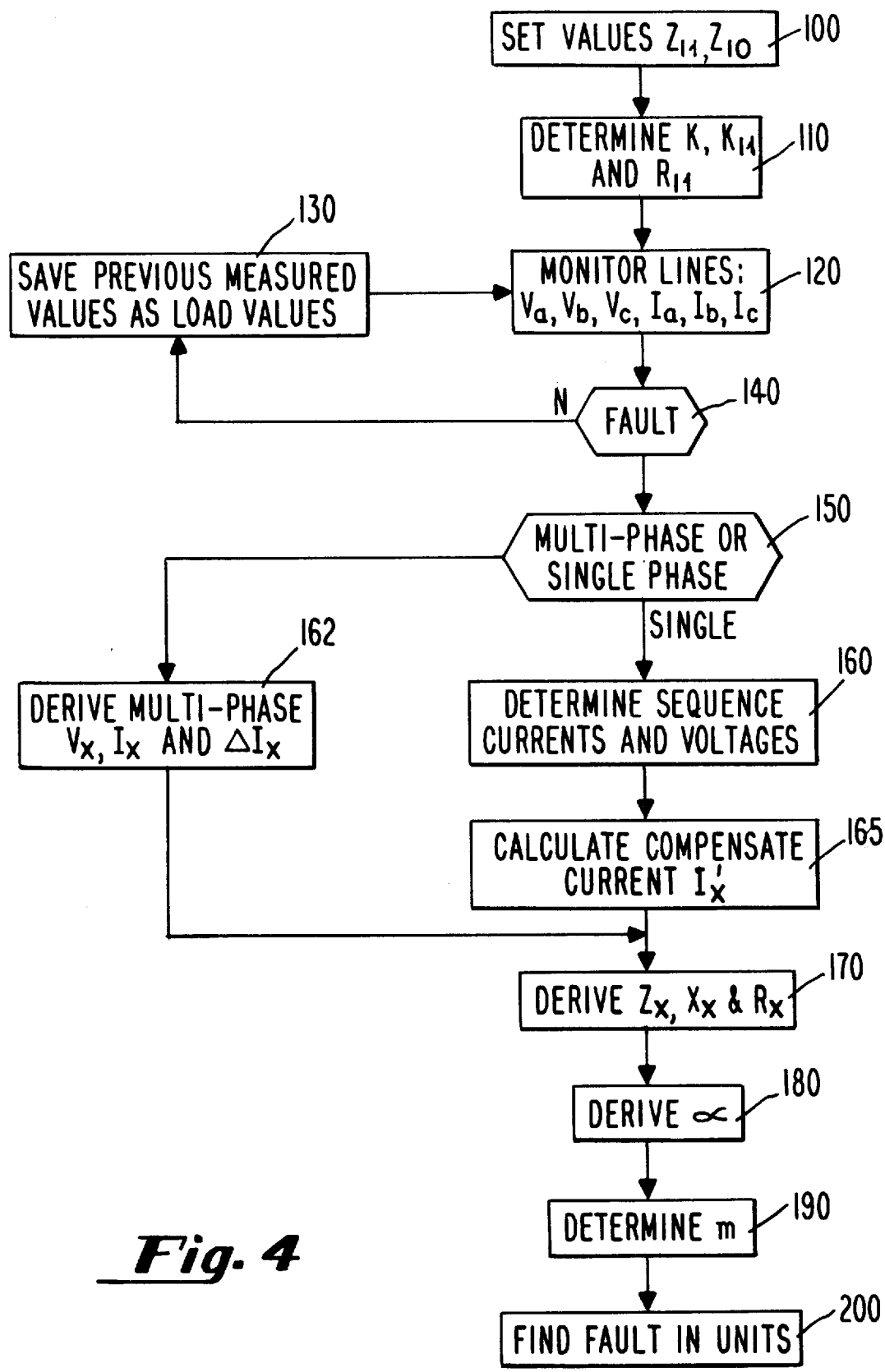
FIG. 4 is a flowchart of an embodiment of a fault location processes in accordance with the present invention.

The present invention is best understood by referring to FIG. 4 in conjunction with the fault model of FIG. 3A. Before the process of determining the fault location can begin, several constant values must be provided. For example, values for line positive sequence impedance, $Z_{11}$, and zero sequence impedance, $Z_{10}$, must be set into the microprocessor based relay 10 (step 100). These constant values are used to derive a cross coupling factor, K, a positive sequence reactance, $X_{11}$ and the positive sequence resistance, $R_{11}$ (step 110).

In a three-phase system, the cross-coupling from other lines induces current in the other phases. Therefore, the current in any one phase must be compensated for the current induced in that phase by the other phases. A "K factor" is used to compensate for the cross.. coupling. The K factor is defined as:

$$K = \frac{Z_{10} - Z_{11}}{Z_{11}} \quad (1)$$

This K factor is then maintained as a constant in relay 10.

The relay then continuously monitors the lines for faults by measuring the voltages and currents of all three phases (i.e., $V_a$, $V_b$, $V_c$, $I_a$, $I_b$, $I_c$) (step 120). Each voltage and current value consists of a set of sampled values, for example; eight samples per cycle. If no fault is detected, the set of sampled values are saved as the load values. Thereafter, when a fault occurs there are two sets of voltages and currents available, the previously saved load values and present post fault values (130). As noted above, the method for determining whether a fault has occurred is beyond the scope of the present invention and therefore its description is left out for brevity and clarity. However, once a fault is detected the fault location is determined (step 140); otherwise the monitoring continues.

The fault type is determined next (i.e., single phase or multiple phase) according to conventional techniques and the process branches accordingly (step 150). As with the fault detection, fault type determination is well-known to those skilled in the art. Accordingly, details of fault type determination are left out of the present description for clarity and brevity.

For a single phase to ground fault, the faulted phase voltages and currents are used to derive the sequence currents and voltages according to well-known sequence network techniques (step 160). Using a phase "a" fault as an example, $I_a$ is converted to $I_{a1}$, $I_{a2}$ and $I_{a0}$ and $V_a$ is converted to $V_{a1}$, $V_{a2}$ and $V_{a0}$. Next, the phase current $I_x$ is compensated for cross-coupling using the K factor (step 165). The compensated current in the phase that experiences the fault is determined as follows:

$$I_x' = I_x + K^* I_{x0} \quad (2)$$

where x is the faulted phase a, b or c.

After the current is compensated, the next step is to determine the impedance, $Z_x$, in the faulted phase. From the compensated phase current, $I_x'$, and measured voltage, $V_x$, the impedance, $Z_x$, is determined according to equation (3) as described below (step 170).

$$Z_x = \frac{V_x}{I_x'} \quad (3)$$

The reactance $X_x$ and the resistance $R_x$ are then derived from the impedance value (step 170).

Finally, the difference in phase, $\alpha_x$, between the compensated current and the negative sequence current is determined (step 180):

$$\alpha_x = arg(I_x') - arg(I_{x2}) \quad (4)$$

All of the values are then available to determine m (step 190) according to the equation:

$$m = \frac{X_x + R_x \tan\alpha_x}{X_{11} + R_{11} \tan\alpha_x} \quad (5)$$

As can be seen from the equation (5) above, if the tan $\alpha_x$ is equal to zero then the equation for m becomes:

$$m = \frac{X_x}{X_{11}} \quad (5.1)$$

indicating that there is no interaction of fault resistance and load current. Additionally, if $$\tan\alpha_x = -\frac{X_{11}}{R_{11}} \quad (5.2)$$

then, the denominator in equation (5) is equal to zero. So, m is calculated as in equation (5.1).

From m, the fault distance in miles (or kilometers) can be determined according to the equation:

$$L = \frac{mX_{11}}{X_{unit}} \quad (6)$$

where $X_{unit}$ is the per unit (e.g., per mile or per kilometer) reactance of the transmission line.

The process for determining fault location in a multiple-phase fault type is somewhat different than that employed in a single-phase fault. In a multiple-phase fault, adjustments are made to the equation before m can be determined. In particular, the values for $V_x$ and $I_x$ are redefined to account for the multiple phases. Additionally, $\Delta I_x$ replaces the negative sequence current in the $\alpha$ equation. The values for $V_x$, $I_x'$, and $\Delta I_x$ are derived according to Table 1 shown below (step 162).

TABLE 1

Substitutions for multiple phase faults.

| Fault Type | $V_x$ | $I_x'$ | $\Delta I_x$ |
|---|---|---|---|
| a-b or a-b-G | $V_{ab} = V_a - V_b$ | $I_{ab}' = I_a - I_b$ | $I_{ab}' - (I_{Lda} - I_{Ldb})$ |
| b-c or b-c-G | $V_{bc} = V_b - V_c$ | $I_{bc}' = I_b - I_c$ | $I_{bc}' - (I_{Ldb} - I_{Ldc})$ |
| c-a or c-a-G | $V_{ca} = V_c - V_a$ | $I_{ca}' = I_c - I_a$ | $I_{ab}' - (I_{Ldc} - I_{Lda})$ |
| a-b-c or a-b-c-G | any of the above | any of the above | any of the above |

Those derived values are used to determine the impedance $Z_x$, according to equation (3), the same equation used in the single phase fault location calculation. From the impedance, $Z_x$, reactance, $X_x$, and resistance, $R_x$, are determined (step 170). Next, $\alpha$ is derived according to the equation below:

$$\alpha = arg(I_x') - arg(\Delta I_x) \quad (7)$$

Thereafter, all the values necessary to calculate m are available (step 190) and m can be determined using the same equation (5) above. Thereafter, the fault location can be determined as in a single phase fault (step 200).

II. Derivations and Additional Details

As is described below, m is derived from the mathematical equivalence of the circuit of FIG. 3A.

$$V_x = I_x' m Z_{11} + I_f R_f \quad (8)$$

(The equation assumes that the fault impedance is real.) From this equation the impedance as measured from Terminal A is derived. The value of that impedance (i.e., $Z_x$) is equal to the impedance of the line up to the point of the fault (i.e., $mZ_1$) plus the impedance after the fault (i.e., the impedance through the fault in combination with the impedance through the load). The impedance measured at terminal A can be represented as:

$$Z_x = \frac{V_x}{I_x'} = mZ_{11} + \frac{R_f * I_f}{I_x'} \quad (9)$$

The line current is represented as $I_x'$ because, in a three-phase system, the cross-coupling from other lines induces current in the other phases. Therefore, the current in any one phase must be compensated for the current induced in that phase by the other phases. A K factor is used for compensating for the cross coupling. The K factor is determined by:

$$K = \frac{Z_{10} - Z_{11}}{Z_{11}} \quad (1)$$

where: $Z_{10}$ is the zero sequence line impedance; $Z_{11}$ is the positive sequence line impedance.

Thus, the compensated current (also referred to as the relay current) in the phase that experiences the fault can be determined as follows:

$$I_x' = I_x + K * I_{x0} \quad (10)$$

where $I_{x0}$ is the zero sequence phase current.

The line current, $I_x$, can be further represented as the current contributed by the source 12 ($E_A$) through the fault resistance, $I_{Af}$, plus the load current, $I_{Ldx}$. Accordingly, $I_x'$ can be further represented as:

$$I_x' = I_{Af} I_{Ldx} + K * I_{x0} \quad (11)$$

Notice that the compensated current only includes the current through the fault contributed by the source $E_A$ and does not include current contributed from the source $E_B$. From equation (2), it can also be appreciated that if $R_f$ is zero, i.e., the fault is a complete short circuit, then:

$$Z_x = mZ_1 \quad (12)$$

where $Z_1$ is total positive sequence impedance of the transmission line.

However, if the fault is not assumed to be a short circuit, then there is some impedance difference which must be accounted for in the equation. In such a case:

$$Z_x = mZ_1 + \Delta Z \quad (13)$$

where $\Delta Z$ represents the difference between the actual fault impedance and a short circuit fault impedance.

Accordingly, by correcting the equation for the value of $\Delta Z$, a more accurate $Z_x$ will be obtained. To that end, referring back to equation (2) it can be seen that:

$$\Delta Z = \frac{I_f R_f}{I_x'} \quad (14)$$

The fault current, $I_f$, is not readily determinable from the relay. As such, a substitution is needed. For a single phase to ground fault wherein a serial connection of positive, negative, and zero sequence networks for the faulted system exists, the following equations are satisfied:

$$I_f = 3I_{f1} = 3I_{f2} = 3I_{f0} = \frac{3(I_{f1} + I_{f2})}{2} \quad (15)$$

Although the above equations are satisfied, the fault sequence currents are also unmeasurable directly. Accordingly, a value measurable from the relay must be substituted for the fault currents. The fault sequence currents are proportional to the line sequence currents. However, other current contributors may be in the system, contributing to the fault current. For example, in FIG. 3A, generator 14 may also contribute some current to the fault. Thus, the fault sequence currents are a function of both current sources 12, 14. Accordingly, the fault sequence currents can be represented as:

$$I_{f1} = \frac{I_{x1}}{K_1} \tag{16}$$

where $K_1$ is the ratio of positive sequence current from source 12 to that of source 14.

$$I_{f2} = \frac{I_{x2}}{K_2} \tag{17}$$

where $K_2$ is the ratio of negative sequence current from source 12 to that of source 14.

$$I_{f0} = \frac{I_{x0}}{K_0} \tag{18}$$

where $K_0$ is the ratio of zero sequence current from source 12 to that of source 14.

As seen from the equation (15) above, there are essentially four options for replacing the fault current with a current measurable from the relay; the first option substitutes positive sequence current for fault current as shown below:

$$I_f = \frac{3I_{x1}}{K_1} \tag{19}$$

Since $I_{11}$ is the positive sequence current of the fault component of line current at the relay, load current should be excluded. This means that the load current must be measured and saved before fault inception so that it can be removed from the line current. For light loads, the load current is more affected by line charging current. As a result, it is difficult to compensate for the charging current exactly as it is distributed along the line.

The second option substitutes negative sequence current for fault current as shown below:

$$I_f = \frac{3I_{x2}}{K_2} \tag{20}$$

Assuming that the power system is under normal conditions and thus balanced, $I_{x2}$ is independent of load current.

The third option substitutes zero sequence current for fault current as shown below:

$$I_f = \frac{3I_{x0}}{K_0} \tag{21}$$

Like negative sequence current, there is no need to know load current when using zero sequence current.

The fourth option substitutes positive and negative sequence currents for the fault current as shown below:

$$I_f = \frac{3}{2} * \left( \frac{I_{x1}}{K_1} + \frac{I_{x2}}{K_2} \right) \tag{22}$$

Assuming that $K_1$ is equivalent to $K_2$. The fourth option can be written as:

$$I_f = \frac{3(I_{x1} + I_{x2})}{2K_1} \tag{23}$$

Starting from the equation for phase current, the fourth option can be written in terms of load and zero sequence currents:

$$I_x = I_{Ldx} + I_{x1} + I_{x2} + I_{x0} \tag{24}$$

then, $$I_{x1} + I_{x2} = I_x + I_{Ldx} + I_{x0} \tag{25}$$

As a result, $$I_f = \frac{3(I_x - I_{Ldx} - I_{x0})}{2K_1} \tag{26}$$

The fourth option can thus be expressed so that no positive or negative sequence currents are required; however, load and zero sequence currents are required. Moreover, this option depends on the assumption that $K_1$ and $K_2$ are equivalent and real.

Considering the four options, the second option, which employs negative sequence current, involves less computations and does not need pre-fault information, assuming $K_2$ is real. By contrast, the third option, which employs zero sequence current, is the simplest approach, if $K_0$ can accurately be assumed to be real. However, $K_0$ may have a relatively large angle because the zero sequence network depends on the grounding grids at substations and the earth along the transmission line. Although the description accompanying the FIG. 3A above uses negative sequence current, any of the above options can be substituted.

After evaluating the fault current substitutions, the impedance equation for the circuit of FIG. 3A can b written in terms of negative sequence current as follows:

$$Z_x = mZ_{11} + \frac{3I_{x2}}{I_x'} \cdot \frac{R_f}{K_2} \tag{29}$$

If $R_f$ and $K_2$ are real, then only $I_{x2}$ and $I_x'$ have a phase angle. Moreover, the relationship between $I_{x2}$ and $I_x'$ can be written as:

$$\frac{I_{x2}}{I_x'} = \left| \frac{I_{x2}}{I_x'} \right| e^{-j\alpha_x} \tag{30}$$

where:

$$\alpha_x = arg(I_x') - arg(I_{x2}) \tag{4}$$

Using equations (30) and (4), the impedance equation can be expressed as follows:

$$Z_x = mZ_{11} + ye^{-j\alpha_x} \tag{29}$$

where:

$$y = 3 \left| \frac{I_{x2}}{I_x'} \right| \frac{R_f}{K_2} \tag{30}$$

Splitting equation (29) into real and imaginary parts yields:

$$R_x = mR_{11} + y \cos \alpha_x \tag{31}$$

and, $$X_x mX_{11} - y \sin \alpha_x \tag{32}$$

Rearranging equations (31) and (32) yields:

$$R_x - mR_{11} = y \cos \alpha_x \tag{33}$$

and $$X_x - mX_{11} = -y \sin \alpha_x \tag{34}$$

Dividing the equations (34) by equation (33) yields:

$$\frac{X_x - mX_{11}}{R_x - mR_{11}} = -\tan\alpha_x \tag{35}$$

The value m can be isolated by rewriting equation (35) as shown below:

$$m = \frac{X_x + R_x \tan\alpha_x}{X_{11} + R_{11}\tan\alpha_x} \quad (5)$$

Significantly, the variable y is factored out of the equations above. Thus, as long as the phases are correct, the magnitude of the currents (e.g. $I_{x2}$ and $I_x$) become irrelevant to the fault location determinations.

The fault location formula derived above is for single phase to ground faults. However, the same principle can be applied to multiple phase faults substituting the original voltage equation as indicated below with a new voltage equation:

$$V_x = I_x'mZ_{11} + \frac{\Delta I_x R_p}{2} K_1 \quad (36)$$

where $R_p$ is the resistance through the multiple phase fault and $V_x$, $I_x$ and $\Delta I_x$ are defined in Table 1 above. The values for $V_x$ and $I_x'$ can be substituted into the single-phase to ground fault equations above to derive the multiple phase fault distance.

In addition to the difference noted above, the determination of $\alpha$ is somewhat different for multiple-phase faults. In multiple phase faults, $\Delta I_x$ is substituted for the negative sequence current used in the single phase fault $\alpha$ calculation. Thus $\alpha$ is rewritten as:

$$\alpha = arg(I_x') - arg(\Delta I_x) \quad (7)$$

With these two adjustments, m can be determined in multiphase faults just as with single phase faults, i.e., according to equation (5) shown above.

The above description of preferred embodiments is not intended to impliedly limit the scope of protection of the following claims. Thus, for example, except where they are expressly so limited, the following claims are not limited to applications involving three-phase power systems. Moreover, the claims are not limited to fault location systems associated with any particular section (i.e., transformer, feeder, high power transmission line, etc.) of a power distribution system.

I claim:

1. A system for locating a fault associated with one or more conductors of a multiple phase electric power transmission or distribution system, said fault being one of the following group of fault types: phase-to-ground, phase-to-phase-to-ground, phase-to-phase, and phase-to-phase-to-phase, comprising:

measuring means for measuring at least one voltage phasor and at least one current phasor, each said voltage phasor being indicative of an amplitude and phase associated with a voltage waveform at a first prescribed location and each said current phasor being indicative of an amplitude and phase associated with a current waveform at said first prescribed location;

processing means coupled to said measuring means for computing a fault location parameter m indicative of the location of the fault, wherein m is computed as:

$$m = \frac{X_x + R_x \tan(\arg(I_x') - \arg(I_m))}{X_{11} + R_{11}\tan(\arg(I_x') - \arg(I_m))}$$

where:
$X_x$=an imaginary portion of a faulted circuit impedance;
$R$=a real portion of a faulted circuit impedance;
$X_{11}$=a positive sequence line reactance;
$R_{11}$=a positive sequence line resistance;

$I_x'$=said current phasor compensated for cross coupling effects in a single-phase to ground fault and a difference between current phasors in a multiple-phase fault; and $I_m$=a negative sequence current of said current phasor in a single-phase-to-ground fault and a difference between pre-fault load currents and said current phasors in a multiple-phase fault.

2. A system as recited in claim 1, wherein said faulted circuit impedance is computed as:

$$Z_x = \frac{V_x}{I_x'}$$

where:
$V_x$=said voltage phasor in a single-phase fault and a difference between voltage phasors in a multiple-phase fault; and,
$I_x'$=said current phasor compensated for cross-coupling effects in a single phase fault and a difference between current phasors in a multiple-phase fault.

3. A system as recited in claim 1, further comprising processing means for determining a location L in distance units to the fault according to the following equation:

$$L = \frac{mX_{11}}{X_{unit}}$$

wherein $X_{11}$ is a measured positive sequence line reactance; and, $X_{unit}$ is a per unit line reactance.

4. A system according to claim 3, wherein the per unit line reactance is in miles.

5. A system according to claim 3, wherein the per unit line reactance is in kilometers.

6. A system as recited in claim 1, wherein said current phasor in a single-phase fault is compensated by adding a compensation current via processing means, wherein said compensation current being equal to:

$$\frac{Z_{10} - Z_{11}}{Z_{11}} * I_{x0}$$

where $Z_{11}$ is a positive sequence line impedance, $Z_{10}$ is a zero sequence line impedance and $I_{x0}$ is the zero sequence current for the faulted phase.

7. A process for locating a fault associated with one or more conductors of a multiple phase electric power transmission or distribution system, said fault being one of the following group of fault types: phase-to-ground, phase-to-phase-to-ground, phase-to-phase, and phase-to-phase-to-phase, comprising the steps of:

a) measuring at least one voltage phasor and at least one current phasor, each said voltage phasor being indicative of an amplitude and phase associated with a voltage waveform at a first prescribed location and each said current phasor being indicative of an amplitude and phase associated with a current waveform at said first prescribed location;

b) computing a fault location parameter m indicative of the location of the fault, wherein m is computed as:

$$m = \frac{X_x + R_x \tan(\arg(I_x') - \arg(I_m))}{X_{11} + R_{11}\tan(\arg(I_x') - \arg(I_m))}$$

where:
$X_x$=an imaginary portion of a faulted circuit impedance;
$R_x$=a real portion of a faulted circuit impedance;

$X_{11}$=a positive sequence line reactance;

$R_{11}$=a positive sequence line resistance;

$I_x'$=said current phasor compensated for cross coupling effects in a single-phase to ground fault and a difference between current phasors in a multiple-phase fault; and $I_m$=a negative sequence current of said current phasor in a single-phase-to-ground fault and a difference between pre-fault load currents and said current phasors in a multiple-phase fault.

8. A process as recited in claim 7, wherein said faulted circuit impedance is computed as:

$$Z_x = \frac{V_x}{I_x'}$$

where:

$V_x$=said voltage phasor in a single-phase fault and a difference between voltage phasors in a multiple-phase fault; and, $I_x'$=said current phasor compensated for cross-coupling effects in a single phase fault and a difference between current phasors in a multiple-phase fault.

9. A process as recited in claim 7, further comprising the step of determining a location L in distance units to the fault according to the following equation:

$$L = \frac{mX_{11}}{X_{unit}}$$

wherein $X_{11}$ is a measured positive sequence line reactance; and, $X_{unit}$ is a per unit line reactance.

10. A process as recited in claim 9, wherein the per unit line reactance is in miles.

11. A process as recited in claim 9, wherein the per unit line reactance is in kilometers.

12. A process as recited in claim 7, wherein said step b) comprises the step of compensating the current phasor in a single-phase fault by adding a compensation current, wherein said compensation current being computed according to the equation:

$$\frac{Z_{10} - Z_{11}}{Z_{11}} * I_{x0}$$

where $Z_{11}$ is a positive sequence line impedance, $Z_{10}$ is a zero sequence line impedance and $I_{x0}$ is the zero sequence current for the faulted phase.

\* \* \* \* \*